US006956761B2

(12) United States Patent
Campbell

(10) Patent No.: US 6,956,761 B2
(45) Date of Patent: Oct. 18, 2005

(54) METHOD TO MANUFACTURE POLYMER MEMORY WITH COPPER ION SWITCHING SPECIES

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/796,000

(22) Filed: Mar. 10, 2004

(65) Prior Publication Data

US 2005/0202620 A1 Sep. 15, 2005

(51) Int. Cl.[7] .............................................. G11C 11/00
(52) U.S. Cl. ....................................................... 365/151
(58) Field of Search ........................................ 365/151

(56) References Cited

U.S. PATENT DOCUMENTS

| | | | |
|---|---|---|---|
| 6,348,365 B1 | 2/2002 | Moore et al. | |
| 6,806,526 B2 | 10/2004 | Krieger et al. | |
| 6,809,955 B2 * | 10/2004 | Bulovic et al. | 365/151 |
| 2002/0163828 A1 | 11/2002 | Krieger et al. | |
| 2002/0163829 A1 | 11/2002 | Bulovic et al. | |
| 2002/0163831 A1 | 11/2002 | Krieger et al. | |
| 2003/0053350 A1 | 3/2003 | Krieger et al. | |
| 2003/0155602 A1 | 8/2003 | Krieger et al. | |
| 2003/0173612 A1 | 9/2003 | Krieger et al. | |
| 2004/0026714 A1 | 2/2004 | Krieger et al. | |
| 2004/0026729 A9 | 2/2004 | Krieger et al. | |
| 2004/0159835 A1 | 8/2004 | Krieger et al. | |
| 2004/0160801 A1 | 8/2004 | Krieger et al. | |
| 2004/0246768 A1 | 12/2004 | Krieger et al. | |

OTHER PUBLICATIONS

M. Kamigaito et al.—"Metal-Catalyzed Living Radical Polymerization," Chem. Rev. 2001, 101, pp. 3689-3745.

* cited by examiner

Primary Examiner—Trong Phan
(74) Attorney, Agent, or Firm—Dickstein Shapiro Morin & Oshinsky LLP

(57) ABSTRACT

A molecular memory cell and methods for forming a molecular memory cell, which allow for easy and inexpensive manufacturing and flexibility in memory system design. Embodiments include a non-volatile molecular memory cell, comprising: a substrate having a conductor, a superionic conductor, a polymer layer over said superionic conductor, a layer of metal ions formed from the superionic conductor and residing between said polymer layer and said superionic conductor, and a second conductor over the polymer layer. Other embodiments include methods for forming a molecular memory cell, wherein a superionic conductor is deposited over a suitable substrate having conductor. A polymeric film is then deposited over the superionic conductor via a living polymerization reaction initiated by the superionic conductor. Furthermore, a layer of excess metal ions from the superionic conductor forms on an upper surface of the superionic conductor. A top conductor is then formed on the polymeric film.

47 Claims, 7 Drawing Sheets

METHOD TO MANUFACTURE POLYMER MEMORY WITH COPPER ION SWITCHING SPECIES

FIELD OF THE INVENTION

The invention relates to the field of random access memory (RAM) devices and resistance devices formed using a resistance variable material.

BACKGROUND

Semiconductor Memory devices can generally be categorized as either volatile or non-volatile, depending on their speed and data retention characteristics. Typical volatile memory devices include random access memory (RAM). RAM devices are typically volatile in that stored data is lost once the power source is disconnected or removed. Non-limiting examples of RAM devices include dynamic random access memory (DRAM), synchronous dynamic random access memory (SDRAM) and static random access memory (SRAM). In addition, DRAMs and SDRAMs also typically store data in capacitors which require periodic refreshing to maintain the stored data.

Non-volatile memory devices, such as erasable programmable read only memory ("EPROM"), retain data almost indefinitely (more than ten years) without an external power supply. Usually, bytes or words can be erased and reprogrammed individually during system operation. EPROM is more expensive and less dense than RAM and is appropriate for storing small amounts of data which is changed infrequently.

In recent years, the number and density of memory elements in memory devices has been increasing. Accordingly, the size of each element has been shrinking, which, in the case of DRAMs, also shortens the element's data holding time. Typically, a DRAM memory device relies on element capacity for data storage and receives a refresh command in a conventional standardized cycle, about every 100 milliseconds. However, with increasing element number and density, it is becoming more and more difficult to refresh all memory elements at least once within a refresh period. In addition, refresh operations consume device power, which is often limited. Finally, fabrication of these memory devices often requires complex silicon processing steps.

Recently, variable resistance memory elements have been investigated for suitability as semi-volatile and non-volatile random access memory elements. For example, U.S. Pat. No. 6,348,365, assigned to Micron Technology, Inc., and hereby incorporated by reference, discloses a programmable conductor random access memory device, including an insulating layer formed of a chalcogenide glass disposed between two electrodes. A conductive material, such as silver, is incorporated into the insulating layer. The resistance of the insulating layer can be programmed between high resistance and low resistance states by application of suitable voltages across the electrodes. These high and low resistance states can define two logic states.

Similar non-volatile molecular memory systems based on polymers are described in U.S. Patent Application Publication No. 2002/0163829 to Bulovic et al. (Bulovic) as well as in U.S. Patent Application Publication Nos. 2002/0163831 and 2003/0155602 to Krieger et al. (Krieger). The Bulovic and Krieger publications each describe memory devices in which a conductive polymer material is formed between two electrodes. As in the chalcogenide-based memory devices described above, the resistance of the polymer material can be switched from a high to a low resistance state in accordance with voltages applied across the electrodes, which can be used to define two logic states. Polymer-based memory systems show potential for use in both short-term and long-term data retention applications and are generally suitable for producing reliable and inexpensive memory devices. However, optimization of polymer-based memory systems can be difficult and time consuming, as forming various polymers selected for their particular electrical characteristics requires changing both reactants and reaction conditions.

Therefore, it is desirable to provide a polymer-based molecular memory device that is easier and less expensive to manufacture and allows flexibility in memory system design such that the polymer memory element can be quickly and efficiently optimized.

BRIEF SUMMARY OF THE INVENTION

Embodiments of the present invention provide molecular memory cells and methods of forming molecular memory cells which are relatively easy and inexpensive to manufacture and which provide flexibility in memory system design.

One embodiment of the invention includes a non-volatile molecular memory cell comprising a substrate supporting a conductor, a superionic conductor, a polymer layer over the superionic conductor, a layer of metal ions formed from the superionic conductor and residing between the polymer layer and the superionic conductor, and a second conductor over the polymer layer.

Another embodiment of the invention includes a non-volatile molecular memory cell comprising a substrate, having an opening to expose an underlying conductor, a superionic conductor formed over the conductor and within the opening, a polymer layer over the superionic conductor, a layer of metal ions formed from the superionic conductor and residing between the polymer layer and the superionic conductor, and a second conductor over the polymer layer.

Another embodiment of the invention includes a non-volatile molecular memory cell which is completely formed within an opening in an insulating layer. The memory cell comprises a substrate, having an opening to expose an underlying conductor, a superionic conductor formed over the conductor and within the opening, a polymer layer over the superionic conductor and recessed within the opening, a layer of metal ions formed from the superionic conductor and residing between the polymer layer and the superionic conductor, and a second conductor over the polymer layer and extending within the opening in the insulating layer.

Yet another embodiment of the invention includes a method for forming a molecular memory cell. In accordance with this method, a superionic conductor is deposited over a suitable substrate wafer having a first conductor. A polymeric film is deposited over the superionic conductor via a living polymerization reaction initiated on the superionic conductor. As a further result of the polymerization reaction, a layer of excess metal ions from the superionic conductor also forms on an upper surface of the superionic conductor. A second conductor is formed on the polymeric film. The mobile ions can be conducted through the superionic conductor and polymer by applying a voltage across the first and second conductors.

In another embodiment, a superionic conductor is deposited over a first metal conductor in an opening in an insulating layer. A polymeric film is deposited over the superionic conductor via a living polymerization reaction initiated on the superionic conductor. As a result of the reaction, a layer of metal ions from the superionic conductor forms on an upper surface of the superionic conductor. A second conductor is then formed on the polymeric film. The mobile ions can then be conducted through the superionic conductor and polymer by applying a voltage across the first and second conductors.

Memory systems, such as an array of molecular memory devices and processing systems utilizing such memory systems are also provided.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

Figure 1A:
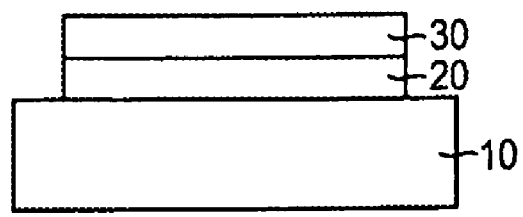
FIGS. 1(a)–(d). show a molecular memory cell in various stages of fabrication in accordance with an exemplary embodiment of the present invention.

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "superionic conductor" is intended to include any solid state material having a high ionic mobility, thus allowing ions to easily flow through the material.

The present invention provides novel electrical devices and methods of forming such devices. In these devices and methods, an easily formed molecular composite material, such as a polymer, is electrically coupled between two electrodes. The composite material includes mobile ions for electrically switching the memory device. The mobile ions are derived from a source layer during formation of the composite material.

The molecular memory device of the present invention can be switched between stable higher resistance and lower resistance states. The molecular memory device normally begins in a high resistance state ("off" state). A write operation can switch the molecular composite material device to a lower resistance state ("on" state) through application of a threshold voltage potential across the molecular composite material. The magnitude of the threshold voltage required to switch the composite material depends, in part, on the particular molecular composite material used.

In a non-volatile exemplary embodiment, the programmed lower resistance state can remain intact for a relatively indefinite period, typically ranging from days to months after the voltage potential is removed. The molecular memory device can be returned to its off state by applying a reverse voltage potential of about the same order of magnitude as used to write the element to its on state. Again, the higher resistance state is maintained once the reverse voltage potential is removed. In this way, such a device can function as a variable resistance memory element having two resistance states, which can define two logic states.

Exemplary molecular memory devices of the present invention may be read by application of a voltage potential that is less than the threshold voltage required for switching the device. During a read operation, the resistance state of the molecular memory device is detected. As described above, molecular memory devices of the present invention can have at least two resistance states, each of which can be used to define a respective logic state.

Many molecular composite materials may be used in the above-described molecular memory devices. Exemplary materials include polyconjugated systems involving polymers with an acyclic conjugation system such as polyvinylenes. Other exemplary materials are discussed in an article by Yu H. Krieger, entitled, "Structural Instability of One-Dimensional Systems As A Physical Principle Underlying the Functioning of Molecular Electronic Devices," Journal of Structural Chemistry, Vol. 40, No. 4, 1999, which is hereby incorporated by reference in its entirety.

Figure 1B:
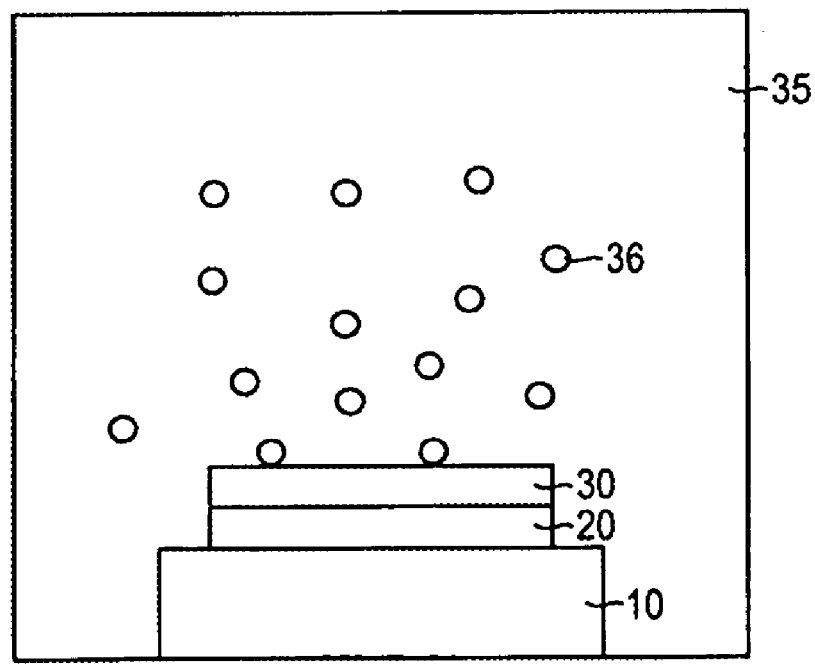
Figure 1C:
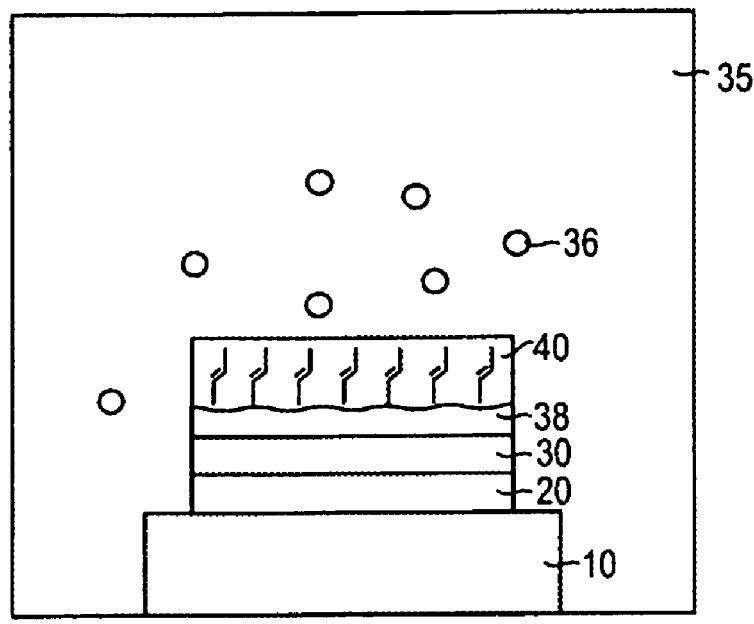
Figure 1D:
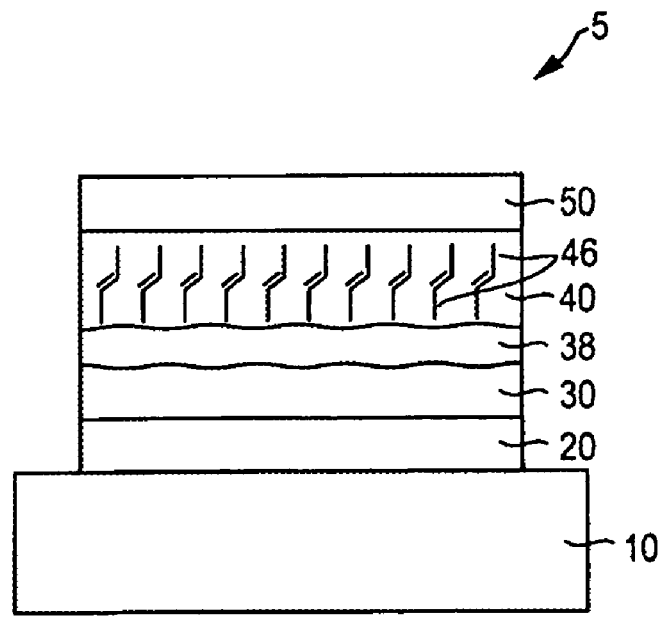

FIGS. 1(a)–(d) show a first exemplary embodiment of the invention in which a memory cell 5 (FIG. 1(d)) and method of forming a memory cell 5 are provided. Referring now to FIG. 1(a), a superionic conductive layer 30 is deposited over a first conductive layer 20, which is formed over a suitable substrate 10. The superionic conductive layer 30 may be selectively deposited over any suitable first conductive layer 20 without deposition on the surrounding insulating material by using techniques well known in the art, such as a chemical electroless bath or CVD techniques. Desirable substrates 10 include silicon nitride wafers. Desirable first conductive layers 20 include, but are not limited to, tungsten (W), nickel (Ni), platinum (Pt), copper (Cu), and gold (Au).

The superionic conductive layer 30 acts as a polymerization initiator for a suite of vinyl monomers such as methacrylates, acrylates, styrenes, vinylpyridines, acrylonitrile, and acrylamides via a reaction known as "living" radical polymerization. Examples of superionic conductive layers 30 include transition-metal complexes containing copper, lead, and silver. Desirable superionic conductive layers 30 include copper bromide (CuBr) and copper selenide ($Cu_2Se$). Living polymerization reactions are generally free from side reactions such as termination and chain transfer and can thus generate polymers of well defined architecture and molecular weights. Living radical polymerization reactions are activated by at least two different mechanisms, depending on the desired polymer. Some reactions proceed immediately when a monomer contacts the superionic conductor. Others require initiation by light or another chemical species. The polymerization reaction can also be controlled such that it proceeds at a rate that allows the polymers 46 (FIG. 1(d)) to form a highly organized matrix 40. It should be understood that the polymers 46 are simplistically represented in FIGS. 1(c) and 1(d) (and also FIGS. 3(d) and 4(b)–(d)). Accordingly, specific structure for the polymers 46 and matrix 40 is not shown. Living polymerization reactions are well known and are further described in an article by Kamigaito, et al., entitled, "Metal-Catalyzed Living Radical Polymerization," Chem. Rev. 101, 3689–3745 (2001), which is hereby incorporated by reference in its entirety.

Referring now to FIGS. 1(b) and 1(c), a layer of polymeric film 40 is deposited over the superionic conductive layer 30, for example, via a living radical polymerization reaction as described above. The substrate 10 and superionic conductive layer 30 are placed in a chamber 35 in which gas monomers 36 of the desired polymer material and any other chemical species required for activation of the reaction are provided. As the gaseous monomers 36 come into contact with the superionic conductive layer 30, a layer of the corresponding polymer 40 begins to form at the gas/superionic conductive layer interface and continues to grow until the reaction is halted. As shown in FIG. 1(c), a further result of the polymerization reaction is the formation of a layer of excess ions 38 on the upper surface of the superionic conductive layer 30. This ion layer 38 is derived from the superionic conductive layer 30. In an exemplary embodiment where CuBr is used as the superionic conductive layer 30, the layer of excess ions 38 comprises $Cu^+$ ions. Likewise, the ion layer 38 comprises $Cu^+$ ons where $Cu_2Se$ is used as the superionic conductive layer 30. As shown in FIG. 1(d), after the polymerization reaction is terminated, a second conductive layer 50 is deposited over the polymer layer 40, and the resulting structure is patterned and etched to create a memory cell 5. The second conductive layer may be any suitable conductor such as tungsten (W), nickel (Ni), platinum (Pt), and gold (Au).

Figure 2A:
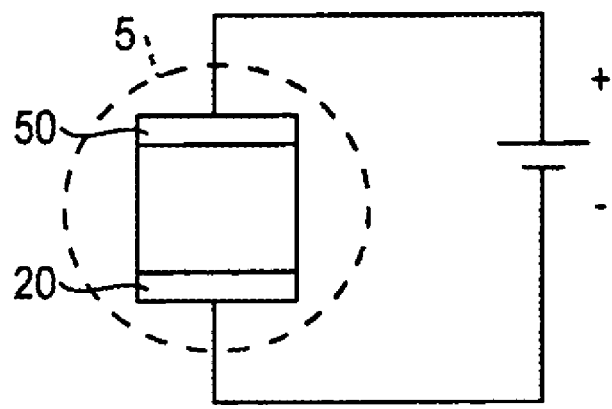
FIGS. 2(a) and 2(b) show the application of a threshold voltage to a molecular memory cell.
Figure 2B:
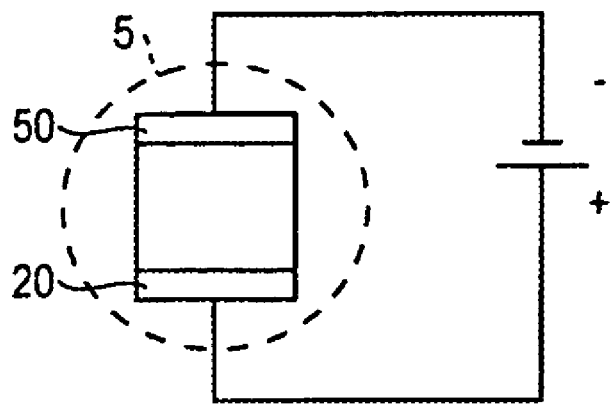

The memory cell 5, is in a high resistance "off" state prior to incorporation of ions from the ion layer 38 into the polymer layer 40. When a threshold voltage is applied across the two conductors, 20 and 50, as shown in FIG. 2(a), ions from the ion layer 38 are driven into the polymer layer 40, causing a drop in the resistance of the of the memory cell 5. The memory cell 5 will remain in this low resistance "on" state indefinitely after the threshold voltage is terminated or until a voltage equal in magnitude, but opposite in polarity, to the threshold voltage is applied across the conductors 20, 50 as shown in FIG. 2(b). This opposite polarity voltage causes the ions to be driven from polymer layer 40 into layer 38, which resets the cell 5 to the "off" state. This state can also be maintained indefinitely without application of a voltage. Reading of the cell is accomplished by applying a voltage which is below the threshold voltage across the cell of the cell 5 and sensing the cell's 5 resistance.

Figure 3A:
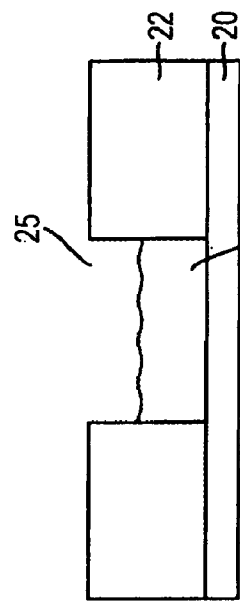
FIGS. 3(a)–(d) show a molecular memory cell in various stages of fabrication in accordance with another exemplary embodiment of the present invention.
Figure 3B:
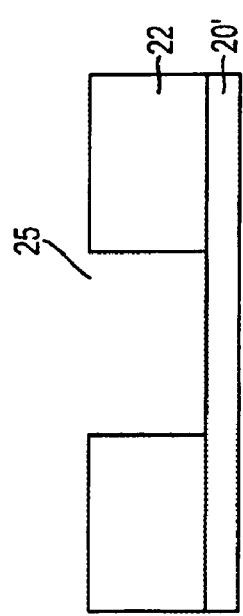
Figure 3C:
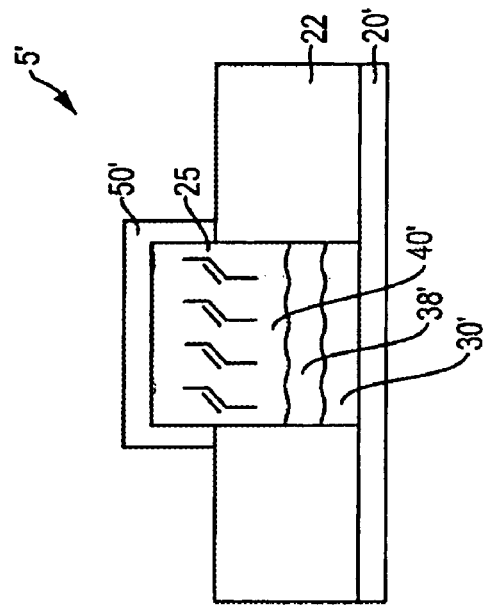
Figure 3D:
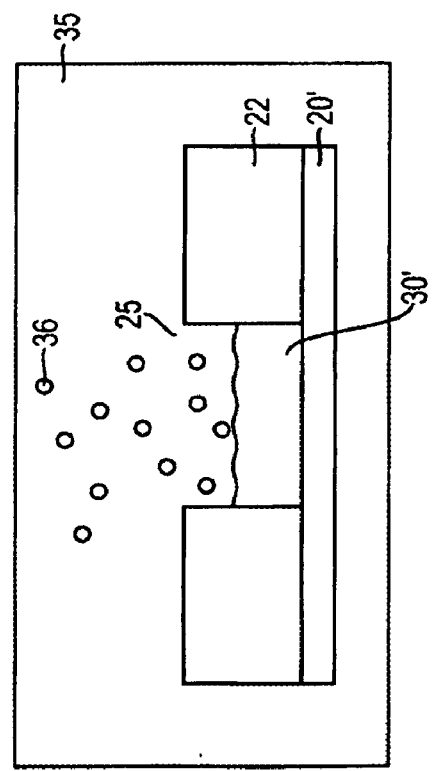

Referring now to FIGS. 3(a)–3(d), showing a second exemplary embodiment of the invention, a memory cell 5' (FIG. 3(d)) and method of forming a memory cell 5' are provided. As shown in FIG. 3(a), an opening 25 is formed in an insulating layer 22 to expose a surface of an underlying conductive layer 20'. A superionic conductive layer 30' is deposited over a first conductive layer 20' within an opening 25 in an insulating layer 22. The thickness of the superionic conductive layer 30' should be allow adequate space for a polymer layer 40' (FIG. 3d)) to begin formation within the opening 25. Desirable superionic conductive layer 30' thicknesses include thicknesses that are less than about 50% of the depth of the opening 25. Desirable materials used to form the superionic conductive layer 30' include CuBr and $Cu_2Se$. The first conductive layer 20' can be any suitable conductor such as tungsten(W), nickel (Ni), platinum (Pt), copper (Cu), and gold (Au).

As shown in FIG. 3(c), a structure including a first conductor 20' and a superionic conductive layer 30' formed within an opening 25 in an insulating layer 22, are placed in a chamber 35, wherein a suitable monomer 36 in gaseous form is provided. As the monomer 36 contacts the superionic conductive layer 30', its corresponding polymer 40' forms at the gas/superionic conductor interface and continues to grow, eventually filling the opening 25, as shown in FIG. 3(d). As a result of the reaction, a layer of excess mobile ions 38' forms at the upper surface of the superionic conductor 30'. A second conductive layer 50' is deposited over the polymer 40'. The second conductive layer is then patterned and etched to form a memory cell 5'as shown in FIG. 3(d). The second conductive layer 50' may be formed from any suitable conductor such as tungsten (W), nickel (Ni), platinum (Pt), copper (Cu), and gold (Au).

Figure 4A:
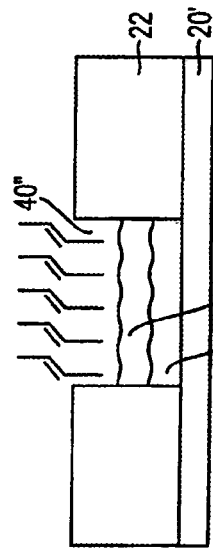
FIGS. 4(a)–(d) show a molecular memory cell in various stages of fabrication in accordance with another exemplary embodiment of the present invention.

Referring now to FIGS. 4(a)–4(d), showing a third exemplary embodiment of the invention, a memory cell 5" and method of forming a memory cell 5" are provided in which the entire memory cell is formed within a via. Similar to the second exemplary embodiment described above, a superionic conductive layer 30' is deposited over a first conductive layer 20' within an opening 25 in an insulating layer 22, as shown in FIG. 4(a). The thickness of the superionic conductive layer 30' should allow adequate space for a polymer layer 40" (FIG. 3(b)) to begin formation within the opening 25. Desirable superionic conductive layer 30' thicknesses include thicknesses that are less than about 50% of the depth of the opening 25. Desirable materials used to form the superionic conductive layer 30' include CuBr and $Cu_2Se$. The first conductive layer 20' can be any suitable conductor such as tungsten (W), nickel (Ni), platinum (Pt), copper (Cu), and gold (Au).

Figure 4B:
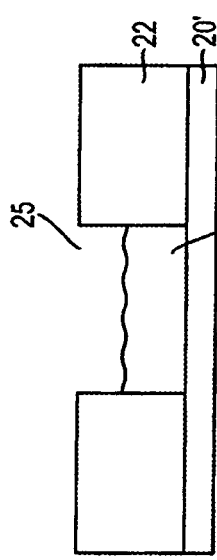
Figure 4C:
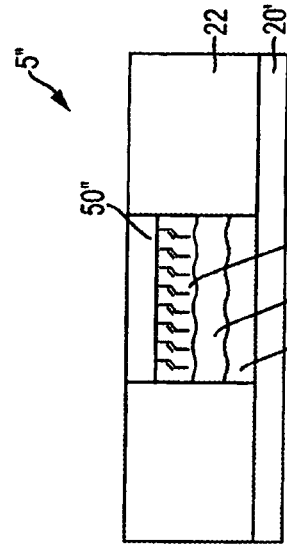
Figure 4D:
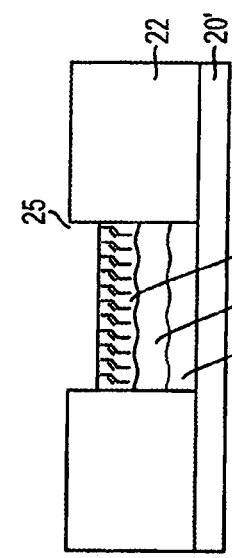

Referring now to FIG. 4(b), a polymer layer 40" is then formed within the opening 25 in the insulating layer 22 as described in connection with the second exemplary embodiment. As a result of the polymer layer 40" formation, a layer of mobile ions 38' forms at the upper surface of the superionic conductor 30'. The polymer layer 40" is recessed within the opening 25 in the insulating layer 22, as shown in FIG. 4(c). A second conductive layer 50" is deposited within the opening 25 and over the polymer layer 40", as shown in FIG. 4(d), thus creating a memory cell 5". The second conductive layer 50" may be formed from any suitable conductor such as tungsten (W), nickel (Ni), platinum (Pt), and gold (Au).

Figure 5:
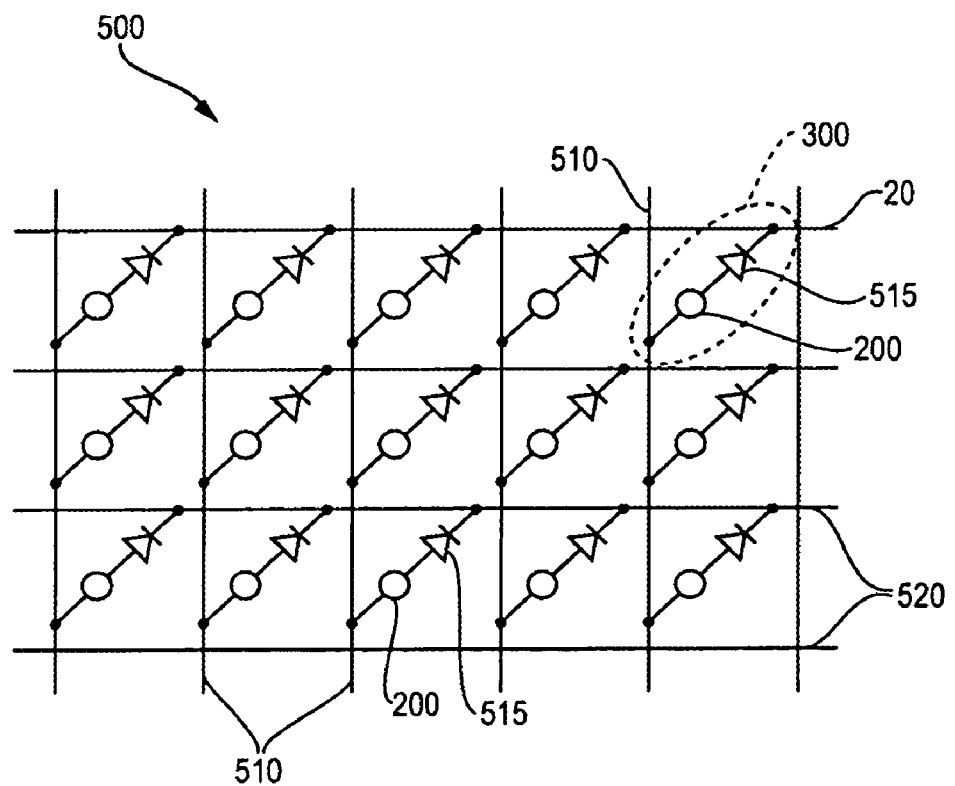
FIG. 5 shows a memory system utilizing an array of polymer based memory devices in accordance with an exemplary embodiment of the present invention.

FIG. 5 is a schematic diagram showing a portion of a memory array 500 containing polymer memory cells 200 in accordance with the invention as-described above. The memory array contains a plurality of memory elements 300 arranged generally in rows and columns. Each memory element 300 contains a polymer memory cell 200 coupled between a first conductive line, such as word line 510 and a diode 515. The diode is further coupled between a second conductive line, such as a bit line 520, and the polymer memory cell 200. Alternatively, the diode 515 could be coupled between the first conductive line 510 and the polymer memory cell 200. The diode 515 serves as a device to access the memory element 300. Other access schemes using transistors can also be used.

Figure 6:
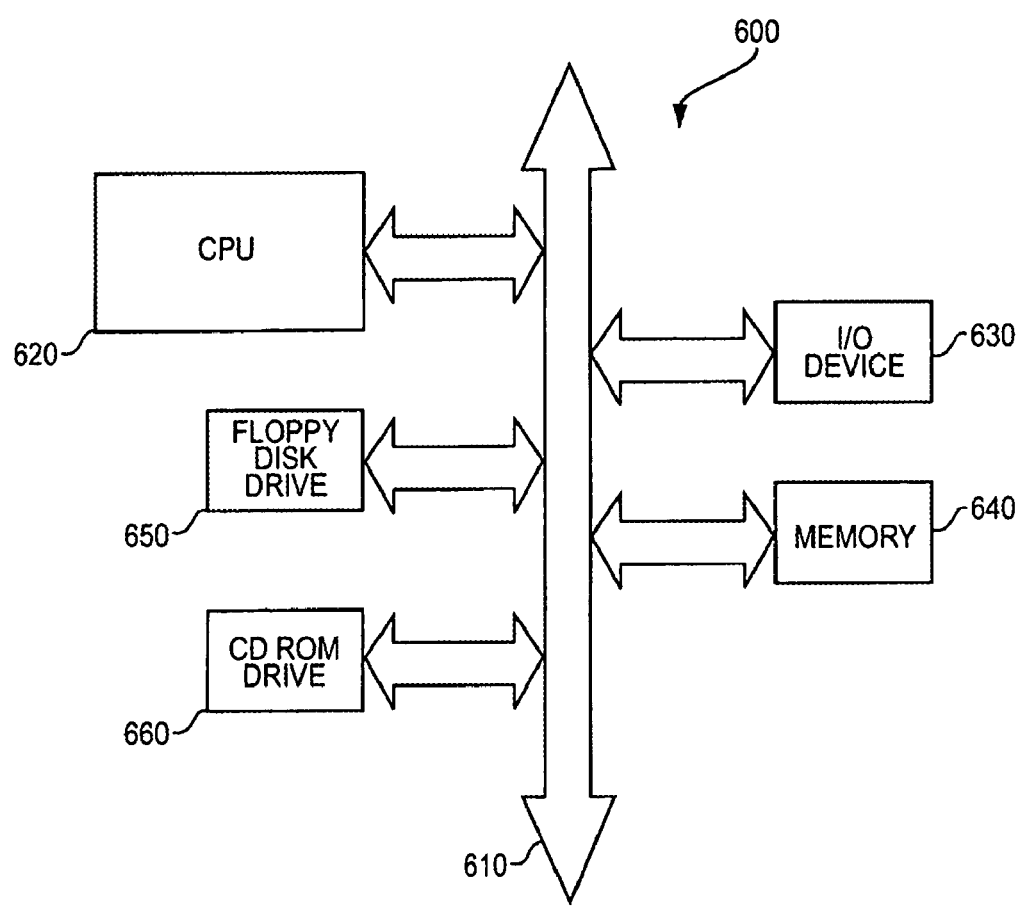
FIG. 6 shows a processing system utilizing memory devices in accordance with an exemplary embodiment of the present invention.

FIG. 6 illustrates a typical processor system 600, which includes a memory circuit 640 comprising an array of variable resistance memory elements formed from the polymer-based memory cells described above. A processor system 600, such as a computer system, generally comprises a central processing unit (CPU) 620, such as a microprocessor, a digital signal processor, or other programmable digital logic devices, which communicates with an input/output (I/O) device 630 over a bus 610. The memory 640 communicates with the system over bus 610 typically through a memory controller. The system 600 can also include floppy disk drive 650 and CD ROM disk drive 660, which communicate with the system 600 over bus 610.

While not being bound by theory, the following discussion is currently believed to be the mechanism by which the polymer memory cells function. As described above, the polymer memory layer 40 switches from a high resistance state to a low resistance state when an applied voltage potential exceeds a threshold voltage. A transition from the low resistance state back to the high resistance state takes place when the polarity of the applied voltage potential is reversed. When an applied voltage potential across conductors 20 and 50 exceeds the threshold voltage, metal ions, for example $Cu^+$ ions, migrate from their original position on the surface of the superionic conductive layer 30 and flow into the molecular matrix formed by the polymer layer 40. The incorporation of $Cu^+$ ions in the polymers results in an increase in the electrical conductivity of the polymer matrix. When the applied threshold voltage potential is reversed, the flow of ions also reverses, resulting in a decrease in the electrical conductivity of the polymer matrix.

Thus, the superionic conductive layer 30 of the present invention serves a dual role as both the chemical initiator for a variety of polymerization reactions and a source of mobile ions used for electrical switching of the polymer-based memory element 40. This dual role of the superionic conductive layer 30 allows flexibility in memory system design in that memory elements of the present invention can be efficiently fine-tuned by selecting polymers for specific characteristics such as speed, non-volatility, and endurance.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed is:

1. A method of fabricating a memory cell, comprising:
    forming a first conductive layer over a substrate;
    forming a superionic conductor over said first conductive layer;
    forming a polymer layer over said superionic conductor in a manner which produces a layer of mobile ions between said polymer layer and said superionic conductor; and
    forming a second conductive layer over said polymer layer.

2. The method of claim 1, wherein said superionic conductor is formed from a transition metal complex.

3. The method of claim 1, wherein said superionic conductor is selected from a group consisting of CuBr and $Cu_2Se$.

4. The method of claim 1, wherein said polymer layer is formed from vinyl monomers.

5. The method of claim 1, wherein said vinyl monomers are selected from a group consisting of methacrylates, acrylates, styrenes, vinylpyridines, acrylonitrile, and acrylamides.

6. The method of claim 1, wherein forming the polymer layer comprises placing monomers in contact with said superionic conductive layer such that said superionic conductor acts as an initiator to form polymers from said monomers.

7. The method of claim 1, wherein said layer of mobile ions is derived from said superionic conductor.

8. The method of claim 1, wherein said first conductor and said second conductor are each formed of a conductor selected from the group consisting of tungsten, nickel, platinum, copper, and gold.

9. A method of forming a memory cell, comprising:
    forming an opening in an insulating layer to expose a portion of an underlying first conductive layer;
    forming a superionic conductor over said first conductive layer in said opening;
    forming a polymer layer over said superionic conductor in a manner which produces a layer of mobile ions between said polymer layer and said superionic conductor; and
    forming a second conductor layer over said polymer layer.

10. The method of claim 9, wherein said superionic conductor is formed from a transition metal complex.

11. The method of claim 9, wherein said superionic conductor is formed from a group consisting of CuBr or $Cu_2Se$.

12. The method of claim 9, wherein the thickness of said superionic conductor is about 50% or less of the depth of said opening.

13. The method of claim 9, wherein said polymer layer is formed from vinyl monomers.

14. The method of claim 13, wherein said vinyl monomers are selected from a group consisting of methacrylates, acrylates, styrenes, vinylpyridines, acrylonitrile, and acrylamides.

15. The method of claim 9, wherein forming the polymer layer comprises placing monomers in contact with said superionic conductor such that said superionic conductor acts as an initiator to form polymers from said monomers.

16. The method of claim 15, wherein forming the polymer layer results in the formation of said layer of mobile ions.

17. The method of claim 9, wherein said first conductor and said second conductor are each formed of a group of conductors consisting of tungsten, nickel, platinum, copper, and gold.

18. A method of forming a memory cell, comprising:
    forming an opening in an insulating layer to expose a portion of an underlying first conductive layer;
    forming a superionic conductor over said first conductive layer in said opening;
    forming a polymer layer over said superionic conductor in a manner which produces a layer of mobile ions between said polymer layer and said superionic conductor;
    recessing said polymer layer within said opening such that a top layer of said polymer layer is substantially level with a top layer of said insulating layer; and
    forming a second conductor layer over said polymer layer.

19. The method of claim 18, wherein said superionic conductor is formed from a transition metal complex.

20. The method of claim 18, wherein said superionic conductor is formed from a group consisting of CuBr or $Cu_2Se$.

21. The method of claim 18, wherein the thickness of said superionic conductor is about 50% or less of the depth of said opening.

22. The method of claim 18, wherein said polymer layer is formed from vinyl monomers.

23. The method of claim 18, wherein said vinyl monomers are selected from a group consisting of methacrylates, acrylates, styrenes, vinylpyridines, acrylonitrile, and acrylamides.

24. The method of claim 18, wherein forming the polymer layer comprises placing monomers in contact with said superionic conductor such that said superionic conductor acts as an initiator to form polymers from said monomers.

25. The method of claim 18, wherein said layer of mobile ions is derived from said superionic conductor.

26. The method of claim 18, wherein said first conductor and said second conductor are each formed of a group of conductors consisting of tungsten, nickel, platinum, copper, and gold.

27. A memory cell comprising:
a first conductive layer formed over a substrate;
a superionic conductor over said first conductive layer;
a polymer layer over said superionic conductor;
a layer of mobile ions derived from said superionic conductor and residing between said polymer layer and said superionic conductor; and
a second conductive layer over said polymer layer.

28. The memory cell of claim 27, wherein said superionic conductor is formed from a transition metal complex.

29. The memory cell of claim 27, wherein said superionic conductor is formed from a group consisting of CuBr and $Cu_2Se$.

30. The memory cell of claim 27, wherein said polymer layer is formed from vinyl monomers.

31. The memory cell of claim 30, wherein said vinyl monomers are formed from a group consisting of methacrylates, acrylates, styrenes, vinylpyridines, acrylonitrile, and acrylamides.

32. A molecular memory cell comprising:
a substrate having an opening in an insulator to expose a portion of an underlying first conductive layer;
a superionic conductor formed over the exposed portion of said first conductive layer;
a polymer layer over said superionic conductor;
a layer of mobile ions between said polymer layer and said superionic conductor; and
a second conductive layer over said polymer layer.

33. The memory cell of claim 32, wherein said superionic conductor is formed from the group consisting of CuBr and $Cu_2Se$.

34. The memory cell of claim 32, wherein said polymer layer is formed from vinyl monomers.

35. The memory cell of claim 34, wherein said vinyl monomers are selected from a group consisting of methacrylates, acrylates, styrenes, vinylpyridines, acrylonitrile, and acrylamides.

36. The memory cell of claim 32, wherein said layer of mobile ions is derived from said superionic conductor.

37. A molecular memory cell comprising:
a substrate having an opening in an insulating layer to expose a portion of an underlying first conductive layer;
a superionic conductor formed over the exposed portion of said first conductive layer;
a polymer layer over said superionic conductor and recessed within said opening such that a top layer of said polymer is substantially level with a top layer of said insulating layer;
a layer of mobile ions between said polymer layer and said superionic conductor; and
a second conductive layer over said polymer layer.

38. The memory cell of claim 37, wherein said superionic conductor is formed from the group consisting of CuBr and $Cu_2Se$.

39. The memory cell of claim 37, wherein said polymer layer is formed from vinyl monomers.

40. The memory cell of claim 39, wherein said vinyl monomers are selected from a group consisting of methacrylates, acrylates, styrenes, vinylpyridines, acrylonitrile, and acrylamides.

41. The memory cell of claim 37, wherein said layer of mobile ions is derived from said superionic conductor.

42. A memory system, comprising:
an array of memory devices, each memory device comprising:
a first conductive layer formed on a substrate;
a superionic conductor over the first conductive layer
a polymer layer over said superionic conductor;
a layer of mobile ions derived from said superionic conductor and residing between said polymer layer and said superionic conductor; and
a second conductive layer over said polymer layer.

43. A processor system, comprising:
a processor; and
a memory circuit electrically coupled to said processor, said memory circuit having memory devices comprising:
a first conductive layer formed over a substrate;
a superionic conductive layer over said first conductive layer;
a polymer layer over said superionic conductor;
a layer of mobile ions derived from said superionic conductor and residing between said polymer layer and said superionic conductor; and
a second conductive layer over said polymer layer.

44. A method of programming a molecular memory cell comprising:
providing a memory cell comprising:
a first conductive layer formed over a substrate;
a superionic conductor over said first conductive layer;
a polymer layer over said superionic conductor;
a layer of mobile ions derived from said superionic conductor and residing between said polymer layer and said superionic conductor; and
a second conductive layer over said polymer layer;
applying a threshold voltage having a first polarity across said first conductive layer and said second conductive layer such that said memory cell is switched from an off state to an on state.

45. The method of claim 44, wherein applying a threshold voltage further comprises driving said mobile ions into said polymer layer.

46. The method of claim 44, further comprising the step of applying a threshold voltage having a second polarity across said first conductive layer and said second conductive layer such that said memory cell is switched from an on state to an off state.

47. A method of reading a memory cell comprising:
providing a memory cell comprising:
a first conductive layer formed over a substrate;
a superionic conductor over said first conductive layer;
a polymer layer over said superionic conductor;
a layer of mobile ions derived from said superionic conductor and residing between said polymer layer and said superionic conductor; and
a second conductive layer over said polymer layer;
applying a voltage less than a threshold voltage across said first conductive layer and said second conductive layer such that the resistance state of the cell can be sensed while not changing the resistance state of the cell.

* * * * *